US012456664B2

(12) United States Patent
Guo et al.

(10) Patent No.: US 12,456,664 B2
(45) Date of Patent: Oct. 28, 2025

(54) SEMICONDUCTOR DEVICE WITH THERMAL DISSIPATION AND METHOD THEREFOR

(71) Applicant: NXP B.V., Eindhoven (NL)

(72) Inventors: Frank.zy Guo, Kaohsiung (TW); Yi-Tien Liao, Kaohsiung (TW); Sam Lai, Kaosiung (TW)

(73) Assignee: NXP B.V., Eindhoven (NL)

( * ) Notice: Subject to any disclaimer, the term of this patent is extended or adjusted under 35 U.S.C. 154(b) by 527 days.

(21) Appl. No.: 18/047,670

(22) Filed: Oct. 19, 2022

(65) Prior Publication Data

US 2024/0136256 A1   Apr. 25, 2024
US 2024/0234258 A9   Jul. 11, 2024

(51) Int. Cl.
*H01L 23/495* (2006.01)
*H01L 21/48* (2006.01)
*H01L 21/56* (2006.01)
*H01L 23/00* (2006.01)
*H01L 23/31* (2006.01)
*H01L 23/36* (2006.01)
*H01L 23/498* (2006.01)

(52) U.S. Cl.
CPC .... *H01L 23/49513* (2013.01); *H01L 21/4853* (2013.01); *H01L 21/4871* (2013.01); *H01L 21/4889* (2013.01); *H01L 21/56* (2013.01); *H01L 23/3157* (2013.01); *H01L 23/36* (2013.01); *H01L 23/4952* (2013.01); *H01L 23/49838* (2013.01); *H01L 24/06* (2013.01); *H01L 24/48* (2013.01); *H01L 2224/0401* (2013.01); *H01L 2224/04042* (2013.01); *H01L 2224/48091* (2013.01); *H01L 2224/48149* (2013.01); *H01L 2924/182* (2013.01)

(58) Field of Classification Search
CPC .......... H01L 23/49513; H01L 23/3157; H01L 23/36; H01L 23/4952; H01L 23/49838; H01L 23/3107; H01L 21/4853; H01L 21/4871; H01L 21/4889; H01L 21/56; H01L 21/50; H01L 24/06; H01L 24/48; H01L 24/85; H01L 2224/0401; H01L 2224/04042; H01L 2224/48091; H01L 2224/48149; H01L 2224/182
See application file for complete search history.

(56) References Cited

U.S. PATENT DOCUMENTS 5,572,066 A   11/1996   Safai et al.
5,866,939 A *  2/1999   Shin .................... H01L 23/3114
                                                257/E23.047
(Continued)

*Primary Examiner* — Dao H Nguyen

(57) ABSTRACT

A method of manufacturing a semiconductor device is provided. The method includes attaching a first die pad of a semiconductor die to a central pad of a package leadframe. The first die pad is located in a central region on an active side of the semiconductor die. A second die pad of the semiconductor die is connected a lead of the package lead frame. The second die pad is located in a periphery region on the active side of the semiconductor die. An encapsulant encapsulates a portion of the semiconductor die and a portion of the package leadframe. A backside surface of the semiconductor die is exposed at a top major surface of the encapsulant, and a backside surface of the central pad exposed at a bottom major surface of the encapsulant.

20 Claims, 12 Drawing Sheets

(56) References Cited

U.S. PATENT DOCUMENTS

| | | | |
|---|---|---|---|
| 6,198,171 B1 | 3/2001 | Huang et al. | |
| 6,759,737 B2* | 7/2004 | Seo | H01L 23/49575 |
| | | | 257/692 |
| 6,812,580 B1 | 11/2004 | Wenzel et al. | |
| 7,064,009 B1* | 6/2006 | McCann | H01L 24/17 |
| | | | 438/123 |
| 7,405,145 B2 | 7/2008 | Khan et al. | |
| 7,436,049 B2 | 10/2008 | Youn et al. | |
| 7,808,087 B2 | 10/2010 | Zhao et al. | |
| 7,939,371 B1* | 5/2011 | Chang | H01L 23/3107 |
| | | | 438/123 |
| 8,183,680 B2 | 5/2012 | Zhao et al. | |
| 8,304,903 B2 | 11/2012 | Herbsommer et al. | |
| 8,329,509 B2 | 12/2012 | Gong et al. | |
| 8,405,230 B2 | 3/2013 | Lee et al. | |
| 8,685,792 B2 | 4/2014 | Chow et al. | |
| 8,685,795 B2 | 4/2014 | Tang | |
| 9,984,992 B2 | 5/2018 | Delacruz et al. | |
| 2002/0020907 A1* | 2/2002 | Seo | H01L 23/4951 |
| | | | 257/778 |
| 2003/0001244 A1* | 1/2003 | Araki | H01L 24/32 |
| | | | 257/E23.037 |
| 2005/0040501 A1 | 2/2005 | Hagen | |
| 2006/0145362 A1* | 7/2006 | Chang | H01L 24/97 |
| | | | 257/E21.504 |
| 2006/0192295 A1* | 8/2006 | Lee | H01L 23/3107 |
| | | | 257/E23.021 |
| 2007/0093000 A1* | 4/2007 | Shim | H01L 25/16 |
| | | | 438/123 |
| 2009/0004782 A1* | 1/2009 | Yu | H01L 23/4951 |
| | | | 438/123 |
| 2018/0025967 A1 | 1/2018 | Haba et al. | |
| 2021/0118778 A1* | 4/2021 | Blansaer | H01L 21/561 |

* cited by examiner

SEMICONDUCTOR DEVICE WITH THERMAL DISSIPATION AND METHOD THEREFOR

BACKGROUND

Field

This disclosure relates generally to semiconductor devices, and more specifically, to semiconductor device with a thermal dissipation feature and method of forming the same.

Related Art

Semiconductor devices are often found in a large spectrum of electronic products—from sewing machines to washing machines, from automobiles to cellular telephones, and so on. Many of these semiconductor devices are produced in high volumes to drive costs down. Factors such as manufacturing processes may be optimized for product costs but could adversely affect product performance and reliability. As technology progresses, semiconductor manufacturing continues to seek ways to improve performance and reliability in these semiconductor devices while keeping product costs in focus.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a thermal dissipation feature. The semiconductor device includes a semiconductor die and package leadframe partially encapsulated with an encapsulant. The semiconductor die is formed with one or more centrally located die pads on an active side and a plurality of die pads located at a periphery of the semiconductor die on the active side. Conductive die connectors are formed on the one or more centrally located die pads. The die connectors may be in the form of a stud bump, copper pillar, or bond wire, for example. The package leadframe includes a central pad and a plurality of leads surrounding the central pad. The semiconductor die is configured in an active-side-down orientation and connected to the package leadframe. For example, the one or more centrally located die pads are connected to the central pad by way of the die connectors and the plurality of periphery die pads are attached to respective leads by way of bond wires. A backside surface of the semiconductor die is exposed at a top surface of the encapsulant as a thermal dissipation feature allowing for direct connection of a head sink or heat spreader, for example. A backside surface of the central pad along with portions of the plurality of leads of the package leadframe are exposed at a bottom surface of the encapsulant. With the exposed central pad of the leadframe, a connection to a ground voltage supply terminal may be formed by way of a printed circuit board, for example. Accordingly, the one or more centrally located die pads may be characterized as ground pads. As a result, the semiconductor die may be formed with a reduced number of periphery die pads allowing for a smaller die area and an exposed backside of the semiconductor die allowing for improved thermal dissipation.

Figure 1:
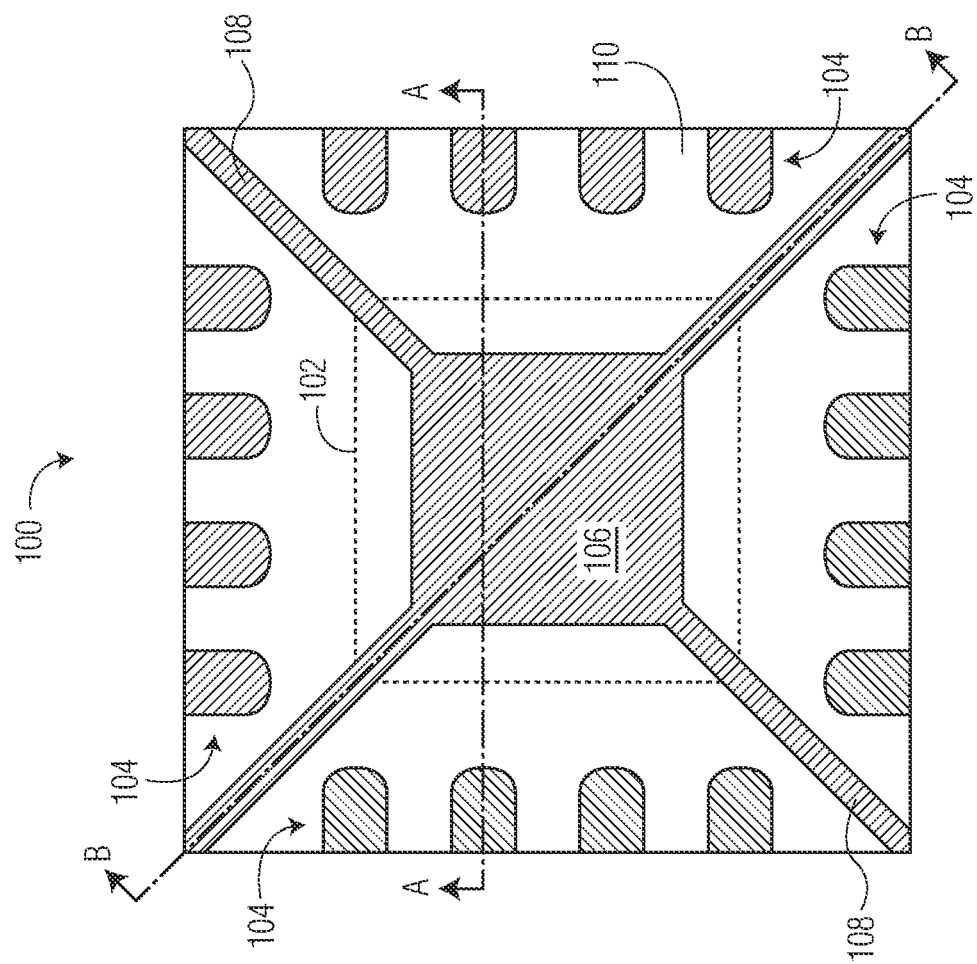
FIG. 1 illustrates, in a simplified bottom-side-up plan view, an example semiconductor device having a thermal dissipation feature at a stage of manufacture in accordance with an embodiment.

FIG. 1 illustrates, in a simplified bottom-side-up plan view, an example semiconductor device 100 having a thermal dissipation feature at a stage of manufacture in accordance with an embodiment. At this stage, the semiconductor device 100 includes an encapsulant 110 (e.g., epoxy molding compound) at least partially encapsulating a semiconductor die 102 and a package leadframe. The underlying semiconductor die 102 is shown as a dashed outline for reference. The package leadframe includes a plurality of leads 104, a central pad 106, and a plurality of tie bars 108. The leads of the plurality of leads 104 are arranged around an outer perimeter of the semiconductor device 100 and surround the central pad 106. Surfaces of the leads 104, central pad 106, and tie bars 108 are exposed through the encapsulant at the bottom side. In this embodiment, the package leadframe is configured for a quad flat no-lead (QFN) type semiconductor device package. The size and shape of the central pad 106 along with the number and arrangement of the leads 104 and tie bars 108 in this embodiment are chosen for illustration purposes. For example, the semiconductor device 100 may include any number of leads 104 and tie bars 108, arranged accordingly. Simplified plan and cross-sectional views of the example semiconductor device 100 taken along lines A-A and B-B at stages of manufacture are depicted in FIG. 2 through FIG. 8.

Figure 2:
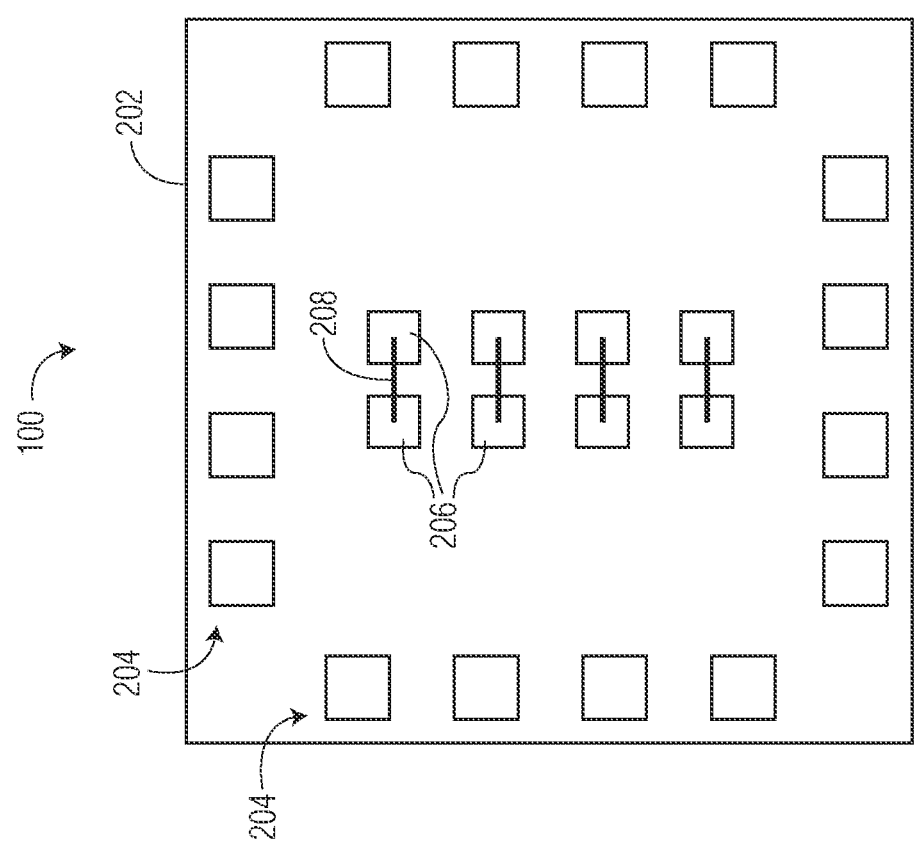
FIG. 2 through FIG. 8 illustrate, in simplified plan and cross-sectional views, the example semiconductor device at stages of manufacture in accordance with an embodiment.
Figure 3:
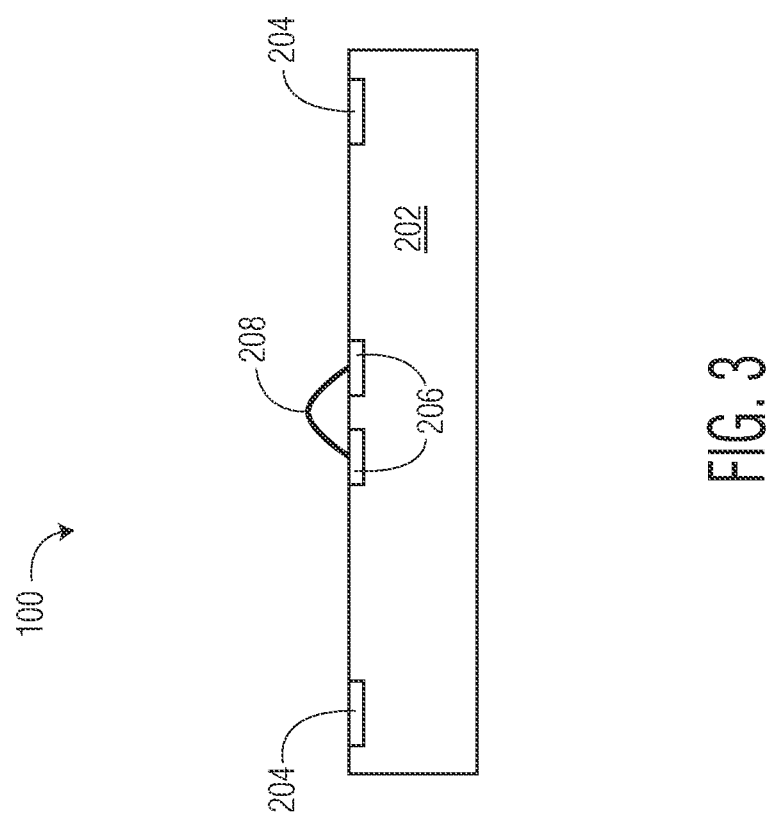

FIG. 2 and FIG. 3 illustrate, in simplified active-side-up plan and cross-sectional views, the example semiconductor device 100 at a stage of manufacture in accordance with an embodiment. For example, FIG. 2 depicts an active-side-up plan view of the semiconductor die 202 and FIG. 3 depicts a corresponding cross-sectional view of the semiconductor die 202 taken along line A-A of the semiconductor device 100 depicted in FIG. 1. At this stage, the semiconductor device 100 includes a semiconductor die 202 configured in an active-side-up orientation. The semiconductor die 202 corresponds to the embedded semiconductor die 102 depicted as a dashed outline in FIG. 1, for example. In this embodiment, the active side of the semiconductor die 202 includes a first plurality of die pads 204 (e.g., periphery die pads) located in a periphery region of the semiconductor die (e.g., proximate to die edges) and a second plurality of die pads 206 (e.g., central die pads) located in a central region of the semiconductor die. The periphery region includes the outer portions of the semiconductor die adjacent to an outer perimeter formed by the edges of the semiconductor die and the central region includes inner portions of the semiconductor die surrounded by the periphery region.

In this embodiment, conductive bond wires 208 are attached connecting pairs of central die pads 206. For example, a first end of the bond wire 208 is connected to a first central die pad 206 and a second end of the bond wire 208 is connected to a second neighboring central die pad 206. Each bond wire 208 is configured to form a loop having an apex portion extended away from the active side of the semiconductor die. The term "conductive," as used herein, generally refers to electrical conductivity unless otherwise described. The number and arrangement of the periphery die pads 204 and central die pads 206 in this embodiment are chosen for illustration purposes.

The semiconductor die 202 includes the active side (e.g., major side having circuitry) and a backside (e.g., major side opposite of the active side). The semiconductor die 202 includes the periphery die pads 204 and central die pads 206 formed at the active side. In this embodiment, the central die pads 206 are configured for connection to a ground voltage supply terminal by way of the package leadframe at a subsequent stage. By providing central die pads 206 as ground voltage supply connection locations, ground pads are no longer required to be located within the arrangement of the periphery die pads 204, for example. Accordingly, the semiconductor die 202 may be formed with a reduced number of periphery die pads allowing for a smaller die area when compared with a traditional pad-limited version of the semiconductor die. The semiconductor die 202 may be formed from any suitable semiconductor material, such as silicon, germanium, gallium arsenide, gallium nitride, and the like. The semiconductor die 202 may further include any digital circuits, analog circuits, RF circuits, memory, processor, the like, and combinations thereof at the active side.

Figure 4:
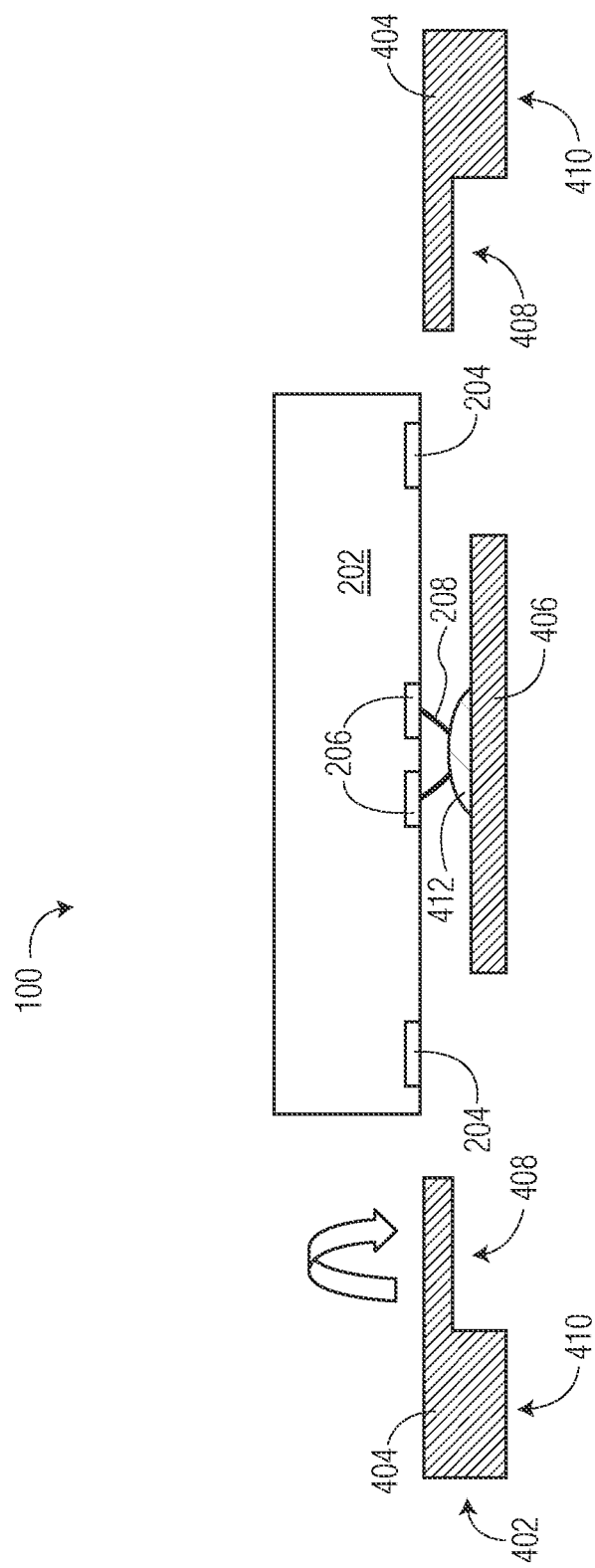

FIG. 4 illustrates, in a simplified bottom-side-down cross-sectional view, the example semiconductor device 100 taken along line A-A at a subsequent stage of manufacture in accordance with an embodiment. At this stage, the semiconductor device 100 includes the semiconductor die 202 reoriented (e.g., flipped) and affixed to a package leadframe 402. In this embodiment, the semiconductor die 202 is configured in an active-side-down orientation with portions of the active side attached to the leadframe 402 (see FIG. 5).

The package leadframe 402 corresponds to the package leadframe depicted in FIG. 1 and includes a plurality of leads 404, a central pad 406, and a plurality of tie bars (see FIG. 5) extending from the central pad 406. The plurality of leads 404 and the central pad 406 correspond to the respective plurality of leads 104 and the central pad 106 depicted in FIG. 1, for example. Each lead 404 of the plurality of leads includes an outer full thickness portion 410 proximate to the outer perimeter of the leadframe 402 and an inner half-etched (e.g., reduced thickness) portion 408. The inner half-etched portion 408 is etched from the bottom side to reduce the lead thickness. In this embodiment, the central pad 406 is half-etched from the top side to reduce the thickness of the central pad and to create a gap between the active side of the semiconductor die 202 and the central pad 406. In this embodiment, the apex portion of the bond wire 208 is conductively connected to the central pad 406 by way of a conductive material 412 (e.g., solder paste, die attach adhesive). Accordingly, a conductive connection is formed between the central pad 406 and central die pads 206 by way of the bond wire 208. The term "half-etched," as used herein, refers to a method of selectively reducing the thickness of portions of the leads by a predetermined amount. The leadframe 402 may be formed from any suitable metal materials, such as copper, nickel, aluminum, iron, or alloys thereof, for example. Surfaces of the leadframe 402 may be bare, partially plated, or fully plated with another metal or an alloy such as silver, gold, palladium, and the like.

Figure 5:
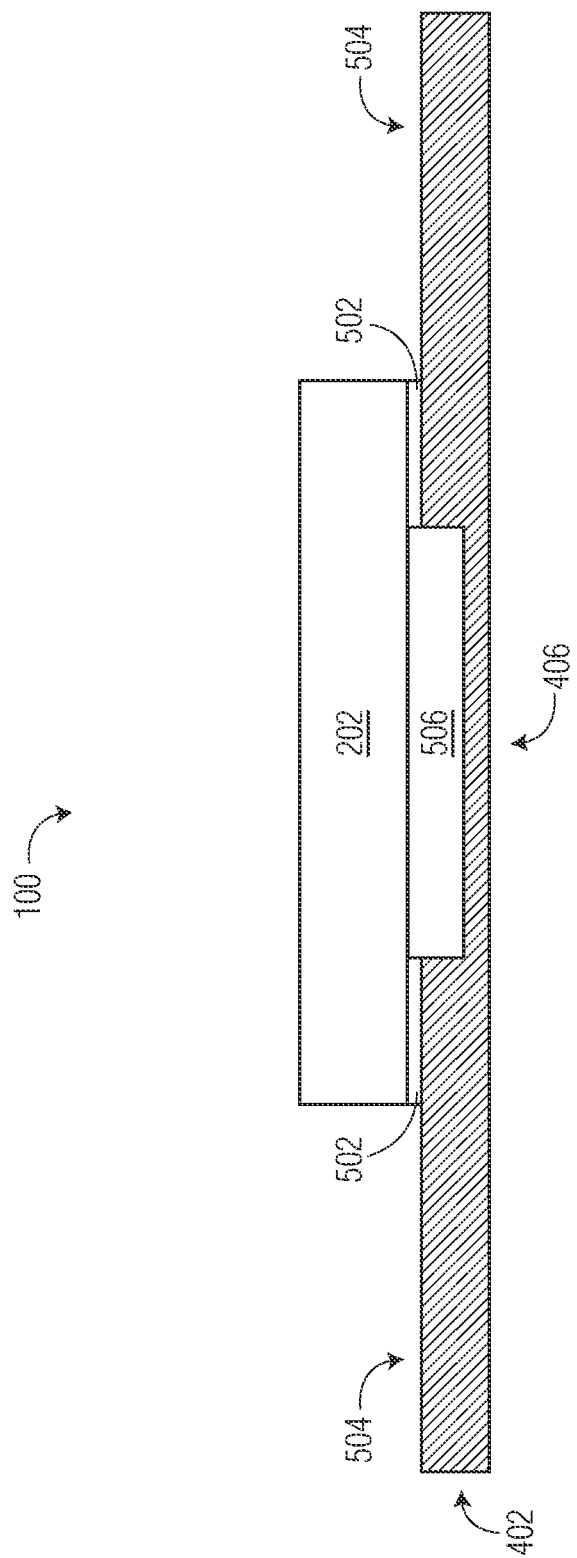

FIG. 5 illustrates, in a simplified bottom-side-down alternate cross-sectional view, the example semiconductor device 100 taken along line B-B at the stage of manufacture of FIG. 4 in accordance with an embodiment. At this stage, the semiconductor device 100 includes the semiconductor die 202 reoriented and affixed to the package leadframe 402. In the alternate cross-sectional view taken along line B-B, tie bars 504 extend outward from the central pad 406 to the outer perimeter of the of the leadframe 402. The tie bars 504 and the central pad 406 correspond to the respective plurality of tie bars 108 and the central pad 106 depicted in FIG. 1, for example. In this embodiment, the tie bars 504 are full thickness and the central pad 106 is half-etched.

Corner regions of the active side of the semiconductor die 202 are attached to tie bars 504 of the leadframe 402 by way of an adhesive material 502. The adhesive material 502 may include die attach materials such as die attach glue, die attach film, and the like, for example. In this embodiment, it may be desirable for the adhesive material 502 to have predetermined thickness. As described above, the central pad 406 is half-etched thus forming a gap 506 between the active side of the semiconductor die 202 and the central pad 406.

Figure 6:
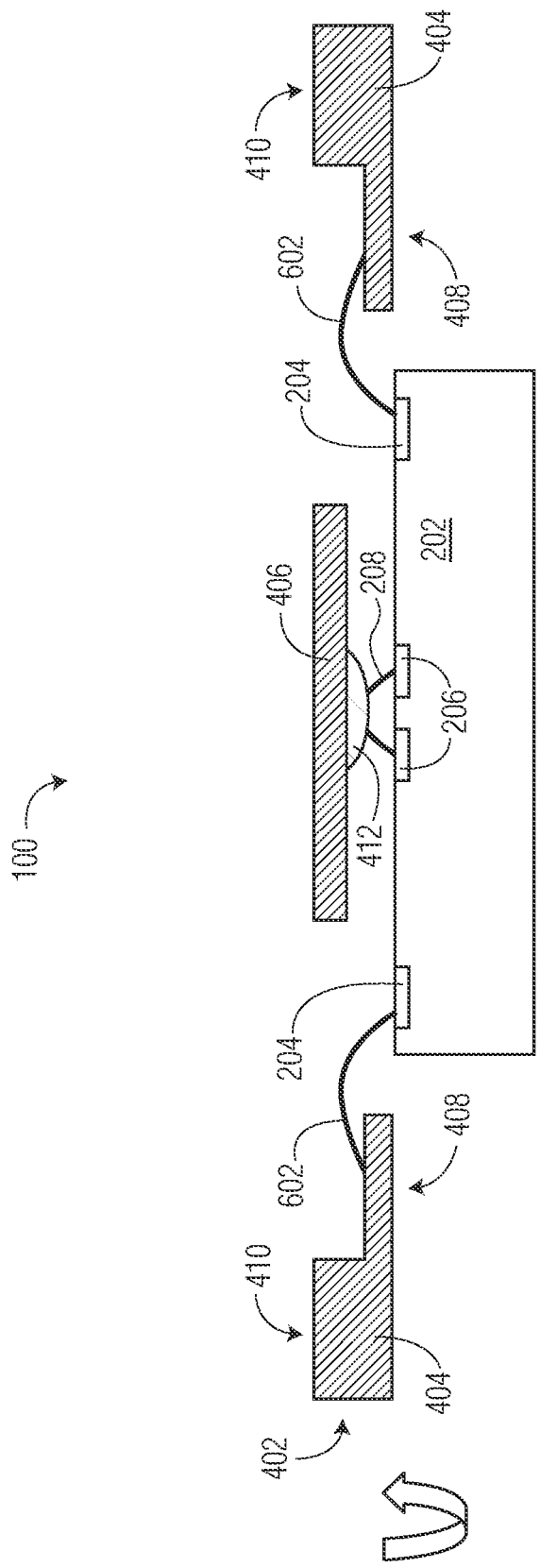

FIG. 6 illustrates, in a simplified bottom-side-up cross-sectional view, the example semiconductor device 100 taken along line A-A at a subsequent stage of manufacture in accordance with an embodiment. At this stage, the semiconductor device 100 includes the die pads 204 of the semiconductor die 202 interconnected to leads 404 by way of bond wires 602. The semiconductor die 202 with attached leadframe 402 is reoriented (e.g., flipped) and placed on a wire bonding apparatus (not shown) to form wire bonds 602. For example, a first end of the bond wires 602 is attached to the die pads 204 by way of a ball bond and a second end of the bond wires 602 is attached to a bonding region at the bottom surface of the half-etched portion 408 of the leads 404 by way of a stitch bond. The bond wires 602 may be formed from suitable conductive materials such as copper, gold, aluminum, silver, and alloys thereof.

Figure 7:
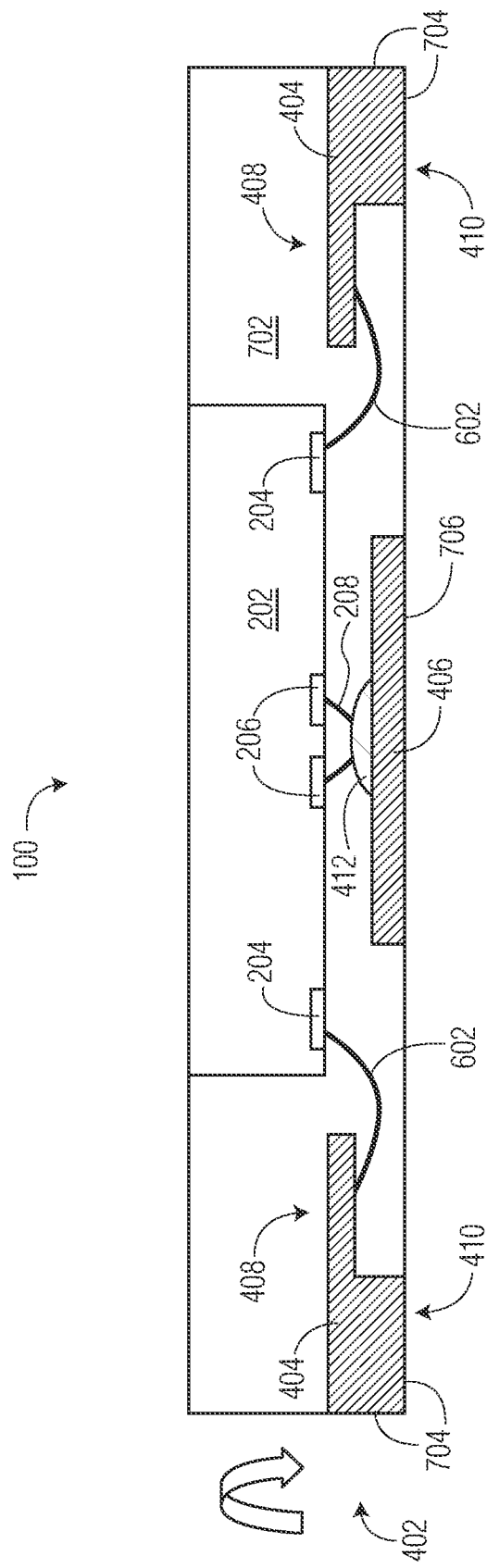

FIG. 7 illustrates, in a simplified bottom-side-down cross-sectional view, the example semiconductor device 100 taken along line A-A at a subsequent stage of manufacture in accordance with an embodiment. At this stage, the semiconductor device 100 includes an encapsulant 702 encapsulating portions of the semiconductor die 202 and portions of the package leadframe 402. The encapsulant 702 may be an epoxy molding compound dispensed during an injection molding encapsulation operation, for example. In this embodiment, the backside of the semiconductor die 202 is exposed at the top major surface of the encapsulant 702 and the bottom surface 706 of the central pad 406 is exposed at the bottom major surface of the encapsulant 702. For example, the backside of the semiconductor die 202 is substantially coplanar with the top major surface of the encapsulant 702. Lead surfaces 704 of the leads 404 are exposed at the bottom major surface and sidewall surfaces of the encapsulant 702.

In some embodiments, the bottom surface 706 of the central pad 406 and bottom and sidewall surfaces 704 of the leads 404 may be pre-plated with a solderable material (e.g., silver, palladium-gold) at a stage of manufacture before encapsulating with the encapsulant 702. For example, with the bottom surface 706 of the central pad 406 exposed, connection to printed circuit board (PCB) is facilitated. Likewise, with the bottom and sidewall surfaces 704 of the leads 404 exposed, interconnection of the leads 404 with pads on the PCB is further facilitated.

Figure 8:
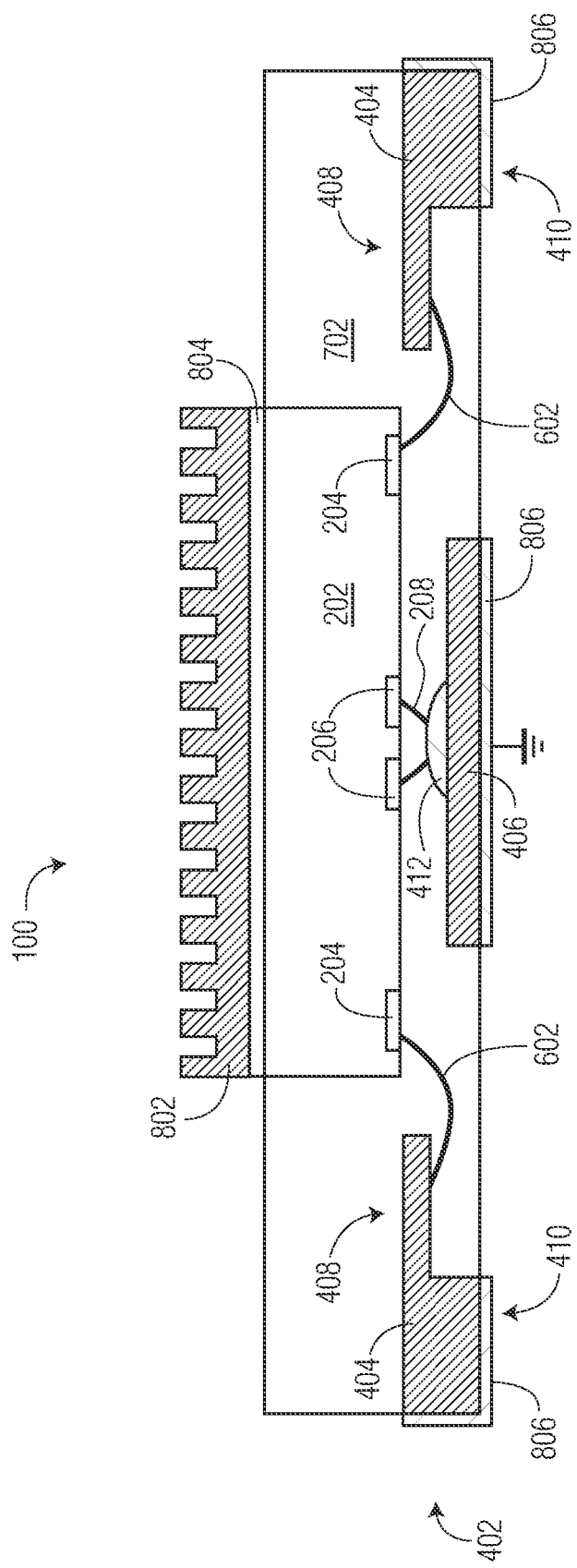

FIG. 8 illustrates, in a simplified bottom-side-down cross-sectional view, the example semiconductor device 100 taken along line A-A at a subsequent stage of manufacture in accordance with an embodiment. At this stage, the semiconductor device 100 includes a heat mitigation structure 802 affixed on the exposed backside of the semiconductor die 202. The heat mitigation structure 802 may be formed as a heat sink or heat spreader and may be attached to the backside of the semiconductor die 202 by way of a thermal conductive paste or adhesive, for example. The heat mitigation structure 802 may be formed from suitable heat dissipation materials such as copper, aluminum, and alloys thereof.

In this embodiment, exposed portions of the package leadframe 402 after encapsulating with the encapsulant 702 are plated. For example, the bottom surface of the central pad 406 and the bottom and sidewall portions of the leads 404 are exposed at the bottom major surface and sidewall surfaces of the encapsulant 702. The exposed bottom surface of the central pad 406 and the bottom and sidewall portions of the leads 404 are plated with a conductive material layer 806. For example, the exposed bottom surface of the central pad 406 and the bottom and sidewall portions of the leads 404 may be electroplated with a tin alloy material to facilitate solder adhesion. By forming the semiconductor device 100 in this manner, superior heat dissipation may be achieved with the leads 404 and the central pad 406 of the package leadframe 402 affixed to a PCB. In this embodiment, the central pad 406 is configured for connection to a ground voltage supply terminal (e.g., illustrated as a ground schematic symbol) by way of the PCB.

Figure 9:
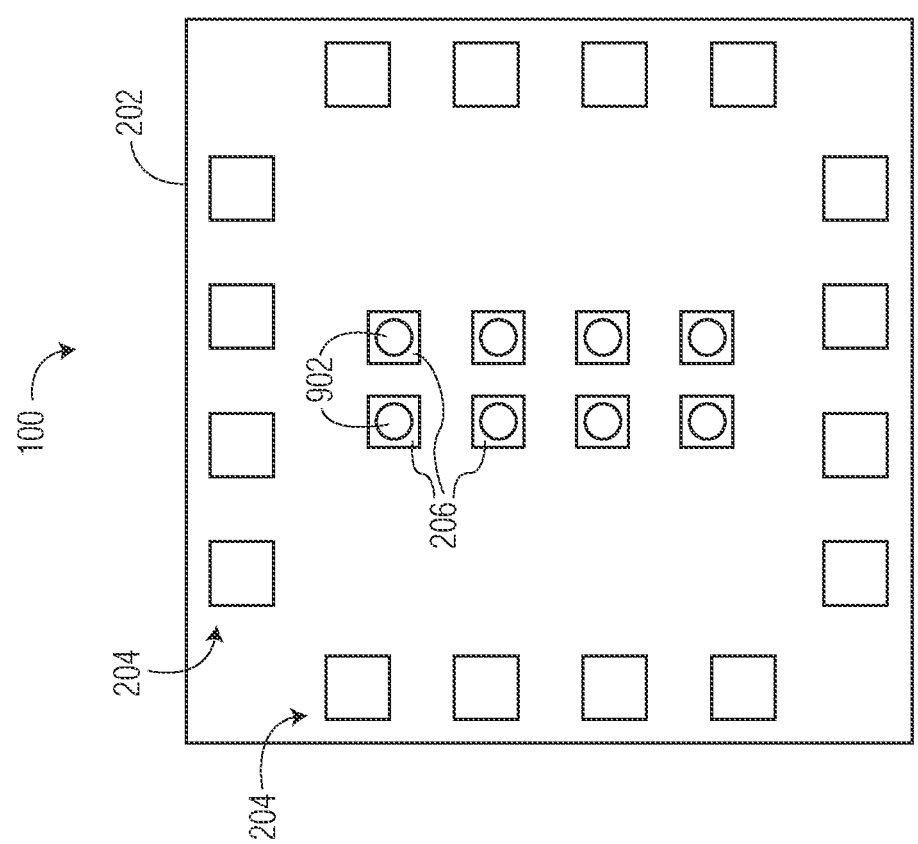
FIG. 9 through FIG. 12 illustrate, in simplified plan and cross-sectional views, the example semiconductor device at alternative stages of manufacture in accordance with an embodiment.
Figure 10:
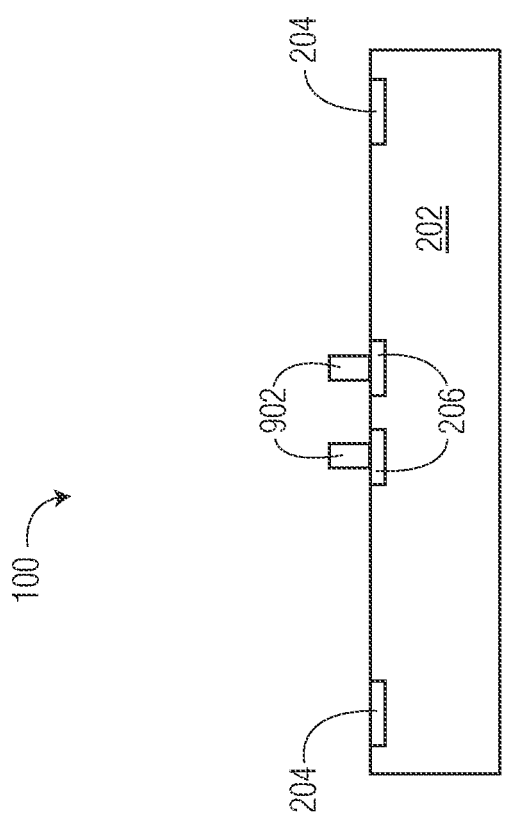
Figure 11:
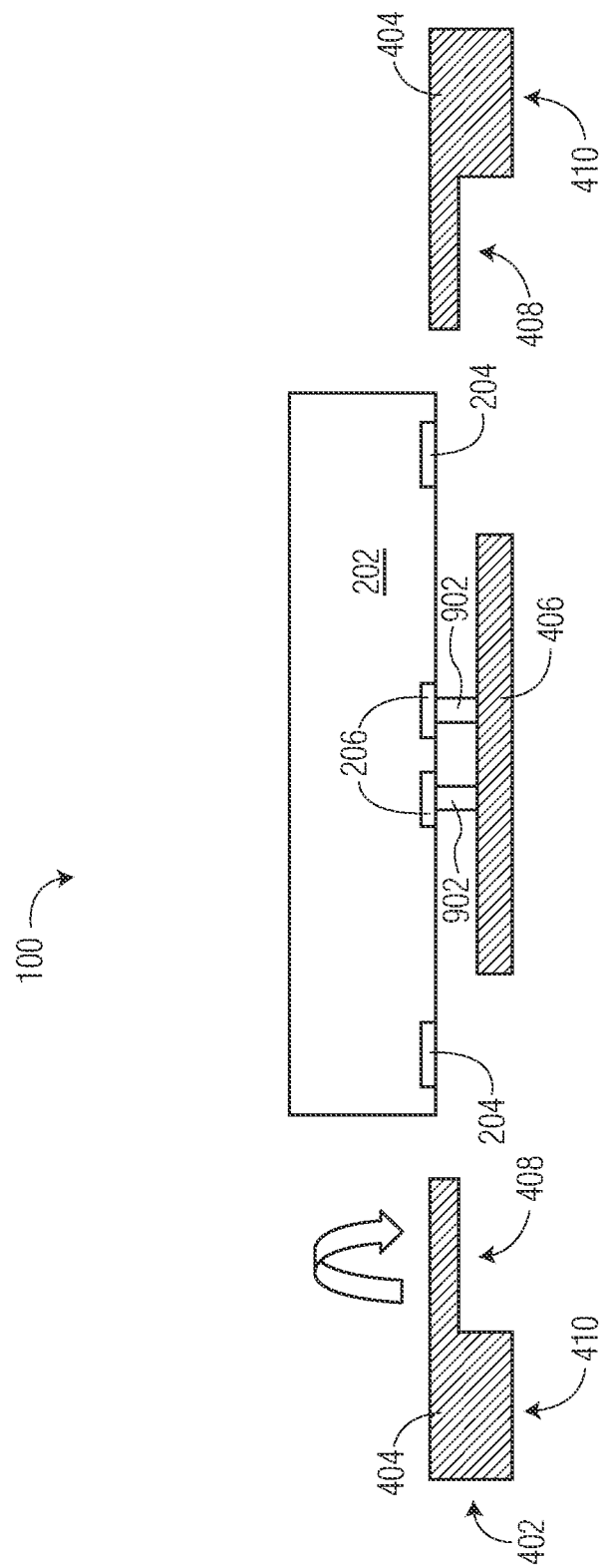

FIG. 9 through FIG. 11 illustrate, in simplified plan and cross-sectional views, the example semiconductor device 100 at alternative stages of manufacture in accordance with an embodiment. The stages of manufacture depicted in FIG. 9 through FIG. 11 are an alternative to the stages of manufacture of the example semiconductor device 100 depicted in FIG. 2 through FIG. 4, with stages of manufacture depicted in FIG. 5 through FIG. 8 remaining substantially similar.

FIG. 9 and FIG. 10 illustrate, in simplified active-side-up plan and cross-sectional views, the example semiconductor device 100 at an alternative stage of manufacture in accordance with an embodiment. For example, FIG. 9 depicts an active-side-up plan view of the semiconductor die 202 with conductive die connectors 902 formed on the central die pads 206 and FIG. 10 depicts a corresponding cross-sectional view of the semiconductor die 202 depicted in FIG. 9 taken along line A-A of the semiconductor device 100. The active side of the semiconductor die 202 includes the periphery die pads 204 located in outer regions of the semiconductor die adjacent to the outer perimeter formed by the edges of the semiconductor die and the central die pads 206 located in inner regions of the semiconductor die surrounded by the periphery die pads 204.

In this embodiment, the conductive die connectors 902 are formed as stud bumps having a first end directly connected to respective central die pads 206. The stud bumps may be formed from gold, copper, aluminum, solder, or alloys thereof, for example. In other embodiments, the conductive die connectors 902 may be formed as copper pillars, solder balls, and the like. The number and arrangement of the periphery die pads 204 and central die pads 206 in this embodiment are chosen for illustration purposes. In this embodiment, the central die pads 206 are configured for connection to a ground voltage supply terminal by way of the package leadframe 402 at a subsequent stage.

FIG. 11 illustrates, in a simplified bottom-side-down cross-sectional view, the example semiconductor device 100 taken along line A-A at a subsequent stage of manufacture in accordance with an embodiment. At this stage, the semiconductor device 100 includes the semiconductor die 202 reoriented (e.g., flipped) and affixed to the package leadframe 402. In this embodiment, the semiconductor die 202 is configured in an active-side-down orientation. Second ends of the conductive die connectors (e.g., stud bumps) 902 are conductively connected to the central pad 406 of the package leadframe 402. Accordingly, a conductive connection is formed between the central pad 406 and central die pads 206 by way of the conductive die connectors 902. By connecting the central die pads 206 to the central pad 406 with the fairly rigid conductive die connectors 902, the semiconductor die 202 is sufficiently supported by the central pad 406 of the package leadframe 402. Therefore, the semiconductor die 202 does not require attachment to the tie bars 502 as depicted in FIG. 5. With the semiconductor die 202 supported solely by the central pad 406 and conductive die connectors 902, the semiconductor die 202 may be positioned closer to the central pad allowing for a thinner semiconductor device 100.

Figure 12:
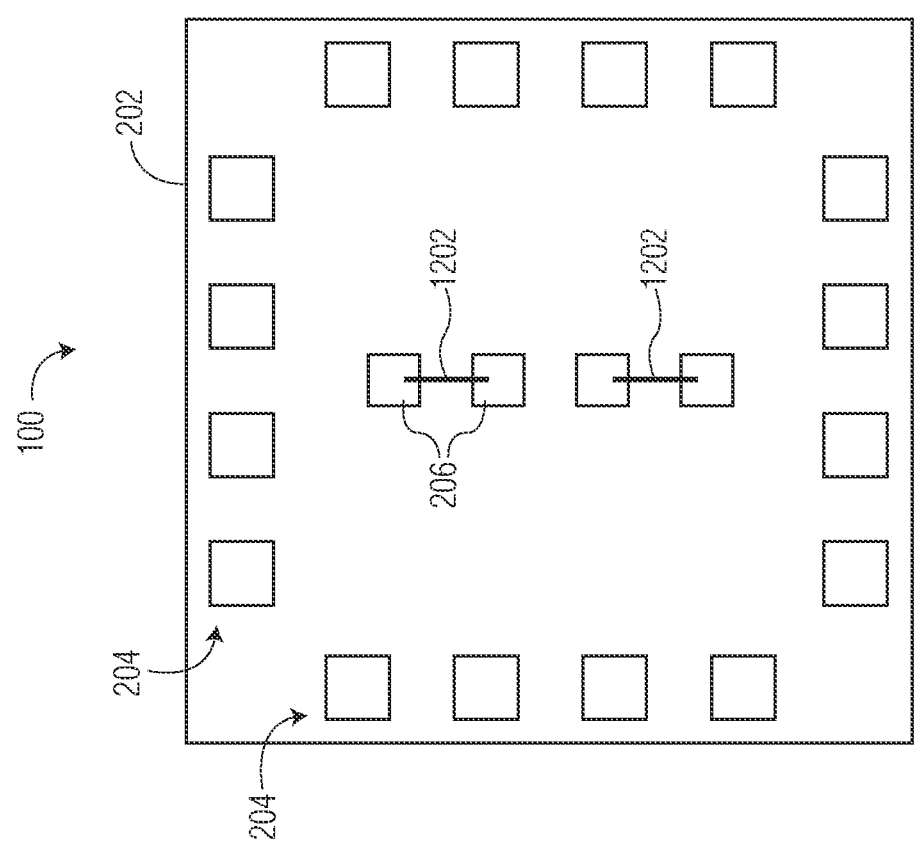

FIG. 12 illustrates, in a simplified bottom-side-down cross-sectional view, the example semiconductor device 100 taken along line A-A at an alternative stage of manufacture in accordance with an embodiment. The stage of manufacture depicted in FIG. 12 is an alternative to the stage of manufacture of the example semiconductor device 100 depicted in FIG. 2, with stages of manufacture depicted in FIG. 3 through FIG. 8 remaining substantially similar. For example, FIG. 12 depicts an active-side-up plan view of the semiconductor die 202 with an alternative arrangement of the central die pads 206. At this stage, the semiconductor device 100 includes the semiconductor die 202 configured in an active-side-up orientation. The active side of the semiconductor die 202 includes the periphery die pads 204 located in outer regions of the semiconductor die adjacent to the outer perimeter formed by the edges of the semiconductor die and the central die pads 206 located in inner regions of the semiconductor die surrounded by the periphery die pads 204.

In this embodiment, the central die pads 206 are arranged in a single column (or row) to reduce the number of central die pads. Conductive bond wires 1202 are attached connecting pairs of central die pads 206. For example, a first end of the bond wire 1202 is connected to a first central die pad 206 and a second end of the bond wire 1202 is connected to a second neighboring central die pad 206. Each bond wire 1202 is configured to form a loop having an apex portion extended away from the active side of the semiconductor die 202.

In this embodiment, the central die pads 206 are configured for connection to a ground voltage supply terminal by way of the package leadframe at a subsequent stage. By providing central die pads 206 as ground voltage supply connection locations, ground pads may be omitted from the arrangement of the periphery die pads 204, for example. Accordingly, the semiconductor die 202 may be formed with a reduced number of periphery die pads allowing for a smaller die area when compared with a traditional pad-limited version of the semiconductor die.

Generally, there is provided, a method including attaching a first die pad of a semiconductor die to a central pad of a package leadframe, the first die pad located in a central region on an active side of the semiconductor die; connecting, by way of a first bond wire, a second die pad of the semiconductor die with a lead of the package lead frame, the second die pad located in a periphery region on the active side of the semiconductor die; and encapsulating with an encapsulant a portion of the semiconductor die and a portion of the package leadframe, a backside surface of the semiconductor die exposed at a top major surface of the encapsulant, and a backside surface of the central pad exposed at a bottom major surface of the encapsulant. The method may further include connecting, by way of a second bond wire, the first die pad with a third die pad located in the central region, the second bond wire having a loop portion extending away from the active side of the semiconductor die, the attaching the first die pad to the central pad includes attaching the loop portion of the second bond wire to the central pad. The attaching the first die pad of the semiconductor die to the central pad of the package leadframe may include attaching the first die pad to the central pad by way of a conductive stud bump. The central pad of the leadframe may be a half-etched portion of the leadframe. The method may further include a tie bar connected to the central pad and exposed at the bottom major surface of the encapsulant, the tie bar having a thickness greater than a thickness of the central pad. A portion of the lead of the leadframe may be half-etched, the first bond wire attached to the half-etched portion of the lead. The method may further include plating a conductive material on portions of the leadframe exposed at the bottom major surface and sidewalls of the encapsulant. The central pad of the leadframe may be configured for connection to a ground voltage supply terminal. The method may further include affixing a heat sink or heat spreader over the exposed backside surface of the semiconductor die by way of a thermal conductive adhesive material.

In another embodiment, there is provided, a semiconductor device including a package leadframe including a central pad and a plurality of leads surrounding the central pad, the package leadframe having a top side and a bottom side; a semiconductor die configured in an active-side-down orientation having a first die pad connected to the central pad and a second die pad connected to a lead of the plurality of leads, the first die pad located in a central region on an active side of the semiconductor die and the second die pad located in a periphery region on the active side of the semiconductor die; and an encapsulant encapsulating a portion of the semiconductor die and a portion of the package leadframe, a backside surface of the semiconductor die exposed at a top major surface of the encapsulant. The semiconductor device may further include a plurality of tie bars connected to the central pad, portions of the tie bars attached to corner regions of the active side of the semiconductor die. The central pad may be half etched such that a top side of the central pad is not in direct contact with the active side of the semiconductor die. The first die pad of the semiconductor die may be connected to the central pad of the package leadframe by way of a conductive stud bump. The semiconductor device may further include a bond wire connecting the first die pad with a third die pad located in the central region, the bond wire having a loop portion extending away from the active side of the semiconductor die, the first die pad and the third die pad connected to the central pad by way of the bond wire loop portion. The second die pad of the semiconductor die may be connected to the lead of the plurality of leads by way of a second bond wire, an end of the second bond wire connected at a half-etched portion of the lead.

In yet another embodiment, there is provided, a semiconductor device including a package leadframe including a central pad and a plurality of leads surrounding the central pad, the package leadframe having a top side and a bottom side; a semiconductor die configured in an active-side-down orientation having a first die pad connected to the central pad and a second die pad connected to a lead of the plurality of leads, the first die pad located in a central region on an active side of the semiconductor die and the second die pad located in a periphery region on the active side of the semiconductor die; and an encapsulant encapsulating a portion of the semiconductor die and a portion of the package leadframe, a backside surface of the semiconductor die exposed at a top major surface of the encapsulant, and a bottom surface of the central pad exposed at a bottom major surface of the encapsulant. The central pad may be half etched such that a top side of the central pad is not in direct contact with the active side of the semiconductor die. The bottom and outer sidewall surfaces of the plurality of the leads may be exposed at the bottom major surface and respective sidewalls of the encapsulant. The second die pad of the semiconductor die may be connected to the lead of the plurality of leads by way of a bond wire, an end of the bond wire connected at a half-etched portion of the lead. The package leadframe may be configured for a quad flat no-lead (QFN) type package.

By now it should be appreciated that there has been provided, a semiconductor device having a thermal dissipation feature. The semiconductor device includes a semiconductor die and package leadframe partially encapsulated with an encapsulant. The semiconductor die is formed with one or more centrally located die pads on an active side and a plurality of die pads located at a periphery of the semiconductor die on the active side. Conductive die connectors are formed on the one or more centrally located die pads. The die connectors may be in the form of a stud bump, copper pillar, or bond wire, for example. The package leadframe includes a central pad and a plurality of leads surrounding the central pad. The semiconductor die is configured in an active-side-down orientation and connected to the package leadframe. For example, the one or more centrally located die pads are connected to the central pad by way of the die connectors and the plurality of periphery die pads are attached to respective leads by way of bond wires. A backside surface of the semiconductor die is exposed at a top surface of the encapsulant as a thermal dissipation feature allowing for direct connection of a head sink or heat spreader, for example. A backside surface of the central pad along with portions of the plurality of leads of the package leadframe are exposed at a bottom surface of the encapsulant. With the exposed central pad of the leadframe, a connection to a ground voltage supply terminal may be formed by way of a printed circuit board, for example. Accordingly, the one or more centrally located die pads may be characterized as ground pads. As a result, the semiconductor die may be formed with a reduced number of periphery die pads allowing for a smaller die area and an exposed backside of the semiconductor die allowing for improved thermal dissipation.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method comprising:
attaching a first die pad of a semiconductor die to a central pad of a package leadframe, the first die pad located in a central region on an active side of the semiconductor die;
connecting, by way of a first bond wire, a second die pad of the semiconductor die with a lead of the package lead frame, the second die pad located in a periphery region on the active side of the semiconductor die; and
encapsulating with an encapsulant a portion of the semiconductor die and a portion of the package leadframe, a backside surface of the semiconductor die exposed at a top major surface of the encapsulant, and a backside surface of the central pad exposed at a bottom major surface of the encapsulant.

2. The method of claim 1, further comprising connecting, by way of a second bond wire, the first die pad with a third die pad located in the central region, the second bond wire having a loop portion extending away from the active side of the semiconductor die, the attaching the first die pad to the central pad includes attaching the loop portion of the second bond wire to the central pad.

3. The method of claim 1, wherein attaching the first die pad of the semiconductor die to the central pad of the package leadframe includes attaching the first die pad to the central pad by way of a conductive stud bump.

4. The method of claim 1, wherein the central pad of the leadframe is a half-etched portion of the leadframe.

5. The method of claim 1, further comprising a tie bar connected to the central pad and exposed at the bottom major surface of the encapsulant, the tie bar having a thickness greater than a thickness of the central pad.

6. The method of claim 1, wherein a portion of the lead of the leadframe is half-etched, the first bond wire attached to the half-etched portion of the lead.

7. The method of claim 1, further comprising plating a conductive material on portions of the leadframe exposed at the bottom major surface and sidewalls of the encapsulant.

8. The method of claim 1, wherein the central pad of the leadframe is configured for connection to a ground voltage supply terminal.

9. The method of claim 1, further comprising affixing a heat sink or heat spreader over the exposed backside surface of the semiconductor die by way of a thermal conductive adhesive material.

10. A semiconductor device comprising:
a package leadframe including a central pad and a plurality of leads surrounding the central pad, the package leadframe having a top side and a bottom side;
a semiconductor die configured in an active-side-down orientation having a first die pad connected to the central pad and a second die pad connected to a lead of the plurality of leads, the first die pad located in a central region on an active side of the semiconductor die and the second die pad located in a periphery region on the active side of the semiconductor die; and
an encapsulant encapsulating a portion of the semiconductor die and a portion of the package leadframe, a backside surface of the semiconductor die exposed at a top major surface of the encapsulant.

11. The semiconductor device of claim 10, further comprising a plurality of tie bars connected to the central pad, portions of the tie bars attached to corner regions of the active side of the semiconductor die.

12. The semiconductor device of claim 11, wherein the central pad is half etched such that a top side of the central pad is not in direct contact with the active side of the semiconductor die.

13. The semiconductor device of claim 11, wherein the first die pad of the semiconductor die is connected to the central pad of the package leadframe by way of a conductive stud bump.

14. The semiconductor device of claim 11, further comprising a bond wire connecting the first die pad with a third die pad located in the central region, the bond wire having a loop portion extending away from the active side of the semiconductor die, the first die pad and the third die pad connected to the central pad by way of the bond wire loop portion.

15. The semiconductor device of claim 11, wherein the second die pad of the semiconductor die is connected to the lead of the plurality of leads by way of a second bond wire, an end of the second bond wire connected at a half-etched portion of the lead.

16. A semiconductor device comprising:
a package leadframe including a central pad and a plurality of leads surrounding the central pad, the package leadframe having a top side and a bottom side;
a semiconductor die configured in an active-side-down orientation having a first die pad connected to the central pad and a second die pad connected to a lead of the plurality of leads, the first die pad located in a central region on an active side of the semiconductor die and the second die pad located in a periphery region on the active side of the semiconductor die; and
an encapsulant encapsulating a portion of the semiconductor die and a portion of the package leadframe, a backside surface of the semiconductor die exposed at a top major surface of the encapsulant, and a bottom surface of the central pad exposed at a bottom major surface of the encapsulant.

17. The semiconductor device of claim 16, wherein the central pad is half etched such that a top side of the central pad is not in direct contact with the active side of the semiconductor die.

18. The semiconductor device of claim 16, wherein bottom and outer sidewall surfaces of the plurality of the leads are exposed at the bottom major surface and respective sidewalls of the encapsulant.

19. The semiconductor device of claim 16, wherein the second die pad of the semiconductor die is connected to the lead of the plurality of leads by way of a bond wire, an end of the bond wire connected at a half-etched portion of the lead.

20. The semiconductor device of claim 16, wherein the package leadframe is configured for a quad flat no-lead (QFN) type package.

* * * * *